United States Patent
Simon et al.

(10) Patent No.: US 10,055,711 B2
(45) Date of Patent: Aug. 21, 2018

(54) ALTERNATOR AND STARTER TESTER WITH WARRANTY CODE FUNCTIONALITY AND METHOD

(75) Inventors: Michael Simon, O'Fallon, MO (US); Garret Miller, Owatonna, MN (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 1077 days.

(21) Appl. No.: 13/402,027

(22) Filed: Feb. 22, 2012

(65) Prior Publication Data
US 2013/0218781 A1    Aug. 22, 2013

(51) Int. Cl.
G06Q 10/00 (2012.01)
G06Q 30/00 (2012.01)
G01R 31/34 (2006.01)
G01R 31/319 (2006.01)

(52) U.S. Cl.
CPC .......... *G06Q 10/20* (2013.01); *G01R 31/319* (2013.01); *G01R 31/343* (2013.01); *G06Q 30/012* (2013.01)

(58) Field of Classification Search
None
See application file for complete search history.

(56) References Cited

U.S. PATENT DOCUMENTS

| | | | |
|---|---|---|---|
| 1,313,061 A | 8/1919 | Brown | |
| 2,578,694 A | 12/1951 | Goldman | |
| 3,745,456 A | 7/1973 | Kahler | |
| 3,893,029 A | 7/1975 | Vensel et al. | |
| 3,903,737 A | 9/1975 | Burden et al. | |
| 3,936,744 A | 2/1976 | Perlmutter | |
| 4,070,624 A | 1/1978 | Taylor | |
| 4,500,304 A | 2/1985 | Foster | |
| 4,641,534 A | 2/1987 | Schneider et al. | |
| 4,666,122 A | 5/1987 | Goodard | |
| 4,781,665 A | 11/1988 | Walker | |
| 4,832,666 A | 5/1989 | Henderson | |
| 4,849,665 A | 7/1989 | Kitamura et al. | |
| 4,867,427 A | 9/1989 | Cunningham | |
| 4,945,272 A | 7/1990 | Ochi et al. | |
| 4,980,589 A | 12/1990 | Ochi et al. | |
| 5,040,493 A | 8/1991 | Gajewski et al. | |
| 5,125,376 A | 6/1992 | Williams et al. | |
| 5,156,573 A | 10/1992 | Byizek et al. | |
| 5,195,366 A | 3/1993 | Duncan | |

(Continued)

FOREIGN PATENT DOCUMENTS

| | | |
|---|---|---|
| CN | 101251441 A | 8/2008 |
| CN | 201555935 A | 8/2010 |

(Continued)

OTHER PUBLICATIONS

International Search Report and Written Opinion dated Apr. 26, 2013 for PCT/US2013/027108 filed Feb. 21, 2013.

(Continued)

*Primary Examiner* — Jan P Mincarelli
(74) *Attorney, Agent, or Firm* — Baker & Hostetler LLP

(57) ABSTRACT

An alternator and starter tester system capable of generating a warranty claim code. The warranty claim code can contain information regarding a diagnostic test and the tested components. The alternator and starter tester system can also encode and transmit the warranty claim code to a supplier or a manufacturer to verify warranty credit.

15 Claims, 7 Drawing Sheets

(56) References Cited

U.S. PATENT DOCUMENTS

| | | |
|---|---|---|
| 5,473,208 A | 12/1995 | Stihi |
| 5,541,840 A | 7/1996 | Gurne et al. |
| 5,550,485 A | 8/1996 | Falk |
| 5,568,916 A | 10/1996 | Gibbons et al. |
| 5,689,517 A | 11/1997 | Ruparel |
| 5,701,089 A | 12/1997 | Perkins |
| 5,705,870 A | 1/1998 | Thomsen et al. |
| 5,718,196 A | 2/1998 | Uchiyama et al. |
| 5,816,588 A | 10/1998 | Fox |
| 5,938,169 A | 8/1999 | Ogawa et al. |
| 6,009,363 A | 12/1999 | Beckert et al. |
| 6,026,461 A | 2/2000 | Baxter |
| 6,147,426 A | 11/2000 | Lepi et al. |
| 6,175,789 B1 | 1/2001 | Beckert et al. |
| 6,181,922 B1 | 1/2001 | Iwai |
| 6,226,305 B1 | 5/2001 | McLoughlin et al. |
| 6,276,194 B1 | 8/2001 | Vinton |
| 6,292,931 B1 | 9/2001 | Dupenloup |
| 6,304,012 B1 | 10/2001 | Chen et al. |
| 6,304,016 B1 | 10/2001 | Frederick et al. |
| 6,394,250 B1 | 5/2002 | Ouchi |
| 6,466,025 B1 | 10/2002 | Klang |
| 6,460,723 B2 | 11/2002 | Davidson et al. |
| 6,553,039 B1 | 4/2003 | Huber et al. |
| 6,634,596 B2 | 10/2003 | Potega |
| 6,647,027 B1 | 11/2003 | Gasparik et al. |
| 6,674,046 B2 | 1/2004 | Bankstahl et al. |
| 6,687,263 B2 | 2/2004 | Van Oldenborgh et al. |
| 6,704,829 B1 | 3/2004 | Hoshi et al. |
| 6,738,696 B2 | 5/2004 | Oi |
| 6,777,945 B2 | 8/2004 | Roberts et al. |
| 6,791,332 B2 | 9/2004 | Raichle |
| 6,803,748 B2 | 10/2004 | Peter |
| 6,834,631 B1 | 12/2004 | Blackburn et al. |
| 6,895,809 B2 | 5/2005 | Raichle |
| 6,986,292 B2 | 1/2006 | Kemnade |
| 7,134,325 B2 | 11/2006 | Krampitz et al. |
| 7,150,186 B2 | 12/2006 | Murphy et al. |
| 7,152,464 B2 | 12/2006 | Krampitz et al. |
| 7,212,911 B2 | 5/2007 | Raichle et al. |
| 7,246,015 B2 | 7/2007 | Bertness et al. |
| 7,472,820 B2 | 1/2009 | Krampitz et al. |
| 7,640,795 B2 | 1/2010 | Raichle |
| 7,690,573 B2 | 4/2010 | Raichle et al. |
| 7,696,759 B2 | 4/2010 | Raichle et al. |
| 8,234,036 B2 | 7/2012 | Shin |
| 2002/0056056 A1* | 5/2002 | Bannatyne et al. ............ 714/25 |
| 2002/0077781 A1 | 6/2002 | Liebl et al. |
| 2004/0104728 A1* | 6/2004 | Bertness et al. ............. 324/429 |
| 2004/0163501 A1 | 8/2004 | Chen |
| 2004/0227523 A1 | 11/2004 | Namaky |
| 2004/0251907 A1 | 12/2004 | Kalley |
| 2005/0088304 A1 | 4/2005 | Hines et al. |
| 2005/0174292 A1 | 8/2005 | McFarland et al. |
| 2006/0119365 A1 | 6/2006 | Makhija |
| 2006/0129301 A1* | 6/2006 | Ashby et al. ................. 701/100 |
| 2006/0136119 A1 | 6/2006 | Raichle et al. |
| 2007/0152702 A1* | 7/2007 | Raichle et al. ............... 324/772 |
| 2007/0294001 A1 | 12/2007 | Underdal et al. |
| 2008/0023547 A1 | 1/2008 | Raichle et al. |
| 2008/0071627 A1* | 3/2008 | Junger ................. G06Q 20/203 705/22 |
| 2008/0249681 A1 | 10/2008 | Bertosa et al. |
| 2009/0300257 A1 | 12/2009 | Vossen |
| 2010/0170944 A1 | 7/2010 | Raichle et al. |
| 2010/0256864 A1 | 10/2010 | Ying |
| 2011/0015823 A1 | 1/2011 | Bertosa et al. |
| 2011/0288954 A1 | 11/2011 | Bertosa et al. |
| 2012/0035876 A1* | 2/2012 | Bertness ................ G06Q 99/00 702/81 |
| 2012/0053870 A1* | 3/2012 | Landry .............. G01R 31/3627 702/63 |

FOREIGN PATENT DOCUMENTS

| | | |
|---|---|---|
| CN | 102066743 A | 5/2011 |
| EP | 0039122 A2 | 11/1981 |

OTHER PUBLICATIONS

CN First Office Action (with English Translation) dated Dec. 29, 2015 for CN Application No. 201380059469.6.

* cited by examiner

ALTERNATOR AND STARTER TESTER WITH WARRANTY CODE FUNCTIONALITY AND METHOD

FIELD OF THE DISCLOSURE

The present disclosure pertains to the field of testing vehicle motor rotary accessory devices. More particularly, the present disclosure relates to devices for testing alternators or starter motors that include warranty claim code capabilities.

BACKGROUND OF THE DISCLOSURE

It is well known in the vehicle industry that certain rotary accessory devices are often used in connection with vehicle motors. Two such well-known accessory devices are alternators and starter motors. Alternators are used in connection with an engine and are belt driven by the engine. Alternators have internal components, which when rotated supply electrical power to a vehicle and/or an engine. Alternators are typically removably but rigidly mounted via a bracket to the engine block or the chassis of the vehicle. In many cases, where a standard type of alternating mounting arrangement is used, the alternator has "ears" with holes that are mounted onto a post or belt attached to the vehicle. This permits pivoting of the alternator so that the alternator can be pivoted around the post against the belt tension in order to install and remove belts, and provide a suitable tension when the belt is installed.

Starter motors are electrical motors, which are typically removably but rigidly mounted to an engine or transmission easing. The starter motor has an electrically driven pinion gear extending from the starter motor that engages a component (typically gears on the flywheel of the engine) in order to be able to rotate the crankshaft of the engine to start it. There is a wide range of attachment mechanisms for attaching said starter motor.

Retailers and component rebuilders are faced with a high percentage of the components that are returned for warranty work, even though the components are actually working properly. This warranty problem. can cost the industry millions of dollars each year. Thus, a need exists for an accurate and easy to use alternator and starter tester and method in order to accurately diagnose the problem. Also, a need exists for verifying that the components that are returned for warranty work are still under warranty by the manufacturer or the supplier. Further, a need exists for tracking and verifying that the warranty work is done correctly with validated results.

SUMMARY OF THE DISCLOSURE

The foregoing needs are met, to a great extent, by the present disclosure, wherein in one aspect, an apparatus is provided that in some embodiments an alternator and starter motor tester includes a warranty claim code.

In accordance with one embodiment of the present disclosure, an alternator and starter motor tester is provided and can include a processor configured to process information and controls an operation of the tester, a memory configured to store the information and software to operate the tester, a motor configured to simulate an engine of a vehicle, a starter motor testing device configured to test a component, a reader configured to read identification information of the component, and an interface module configured to generate a warranty claim code, the warranty code having the identification information of the component, and a test result of the component, wherein the memory, the motor, the starter motor testing device, the reader and the interface module are in communication with the processor.

In accordance with another embodiment of the present disclosure is a method of testing a starter motor or an alternator which can include receiving information associated with a component via an input device, performing a diagnostic test on the component with a component tester, generating, via a processor, a warranty claim code based at least in part on the information associated with the component and a test result, transmitting the warranty claim code to a remote computing device via an interface module, and receiving a determination based on the warranty claim code if the component is still under warranty.

In accordance with yet another embodiment of the present disclosure, an alternator and starter motor tester is provided and can include a means for processing information, wherein the mean for processing controls an operation of the tester, means for storing the information and software to operate the tester, means for simulating a motor of a vehicle, means for testing a component, means for reading identification information of the component, and means for generating a warranty claim code based at least in part on the identification information of the component and a test result of the component, wherein the means for storing, the means for simulating, the means for testing, the means for reading, and the means for generating are in communication. with the means for processing.

There has thus been outlined, rather broadly, certain embodiments of the disclosure in order that the detailed description herein may be better understood, and in order that the present contribution to the art may be better appreciated. There are, of course, additional embodiments of the present disclosure that will be described below and which will form the subject matter of the claims appended hereto.

In this respect, before explaining at least one embodiment of the present disclosure in detail, it is to be understood that the present disclosure is not limited in its application to the details of construction and to the arrangements of the components set forth in the following description or illustrated in the drawings. The present disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

DETAILED DESCRIPTION

Figure 1:
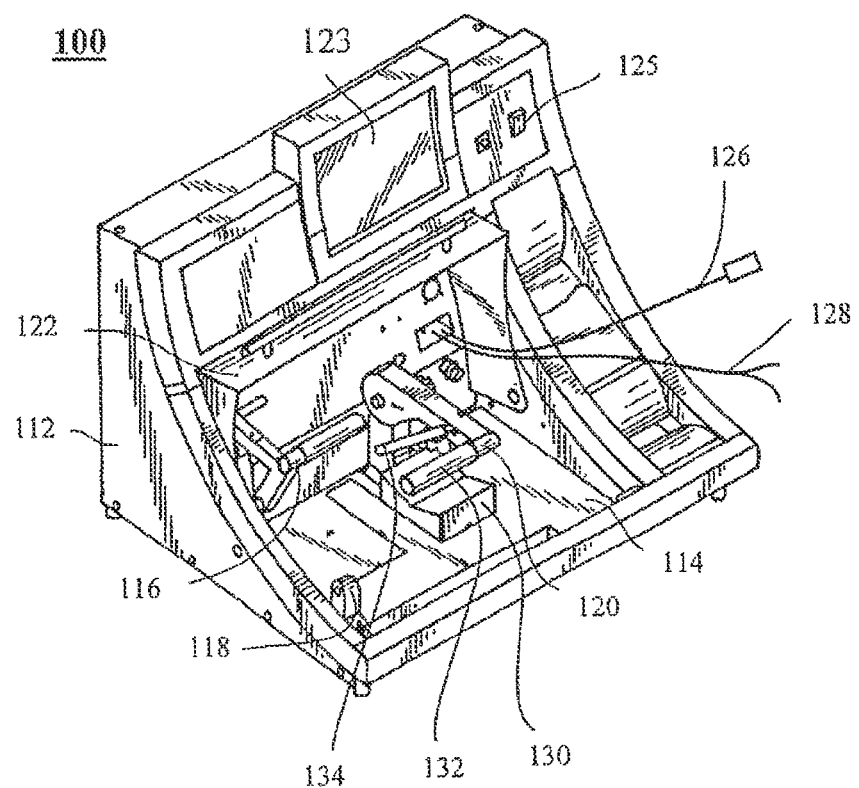
FIG. 1 is a perspective view of an alternator and starter motor tester according to an embodiment of the present disclosure.

The present disclosure will now be described with reference to the drawing figures, in which like reference numerals refer to like parts throughout. An embodiment in accordance with the present disclosure provides an alternator and starter tester for holding and testing an alternator or starter motor that includes a protective hood or cover, a controller connecting an LCD touch-screen, a barcode connector, USB host and USB function connectors, an Ethernet connector, and a flash memory connector.

An embodiment of the present testing apparatus is illustrated in FIG. 1. FIG. 1 illustrates an alternator and starter tester 100 ("tester") including a housing 112 and a base plate (or chassis) 114. The housing 112 surrounds and supports various operative components of the alternator and starter tester 100 including, for example, a power supply, diagnostic electronics, mounting devices, a monitor screen 123, a protective door cover 122, and the like. In one embodiment, the monitor screen 123, such as an LCD touch-screen, may be implemented within the housing 112. A. test power button 125, such as a toggle-switch design, is provided on the housing 112 to turn the tests on and off. A main power switch (not shown) is also used to provide main power to the alternator and starter tester 100.

The alternator and starter tester 100 also includes an alternator belt tensioning arrangement generally designated 116, an alternator mounting arrangement generally designated 118, and a starter holder arrangement generally designated as 120. Each of the belt tensioning arrangement 116, the alternator mounting arrangement 118, and the starter motor holder arrangement 120 can be mounted directly to the base plate 114.

The alternator belt tensioning arrangement 116 and the mounting arrangement 118 together can hold the alternator in place for testing. An installation assembly that includes one or more mounting pins (not shown) can be placed in the mounting arrangement 118 in order to mount the alternator. The alternator can be horizontally or vertically mounted depending on the type of alternator. The pins are replaceable to allow flexibility for current and future applications.

Also shown in FIG. 1, a test adapter 126 and power leads 128 can be connected to the alternator in order to provide test information to the alternator and starter tester 100. Additionally, a drive belt (not shown), such as a serpentine or V belt and the like, can be connected to the alternator and the motor of the alternator and starter tester 100 to simulate the alternator operating environment in the vehicle. A gas piston may be used for belt tension to ensure consistent belt tension during testing and thereby eliminating over tensioning or slipping belts that may affect test results.

The starter motor holder arrangement 120 includes a quick release ratchet system, wherein the starter is placed on a pad and held in place by the ratchet system. The starter motor holder arrangement 120 includes, a support pad 130, a handle 132 and a release lock 134 that when operated engages and disengages a lock (pawl, for example) from a ratchet (both not shown). The starter motor holder arrangement 120 eliminates straps, uses quick ratchet to hold starter without the need of any additional holding mechanism or user assistance during the test. Thus, this speeds loading and unloading of components to be tested. The starter is placed on the support pad 130 and the operator squeezes the release lock and presses down on the handle 132 to engage the starter and then releases the lock so that the lock is again reengaged. Power leads 128, including, for example, battery lead, ground lead, solenoid lead and sense lead are connected to the starter in order to conduct the tests.

FIG. 1 also illustrates the monitor screen 123 that can operate as a touch-screen LCD user interface that communicates with a controller (discussed below) as well as to display information to the user. The present disclosure also utilizes an on-line tutorial for quickly training new personnel on the unit's functionality and on-line help screens to help new users navigate and test components during a test. The LCD touch-screen offers step-by-step instructions for setting up the tester and conducting tests. The alternator and starter tester 100 can also include on-screen hook up diagrams and a specification library database, which eliminate the need for paper flipcharts and enables software updates for new alternator applications or starter configurations. This database can be updated by compact flash, flash drive, other memory media or remotely via a network connection (discussed below). The monitor screen allows users to run advertising screens when the tester is not in use. These screens can be uploaded to the tester from a user's network server or uploaded from a compact flash or other memory media. Additionally, the screen is capable of displaying information in various updatable languages.

The alternator and starter tester 100 outputs "Good/Bad" or "Pass/Fail" results to the user. A user printout that details test results and provides technical advice for other potential problems can be provided to the user.

Figure 2:
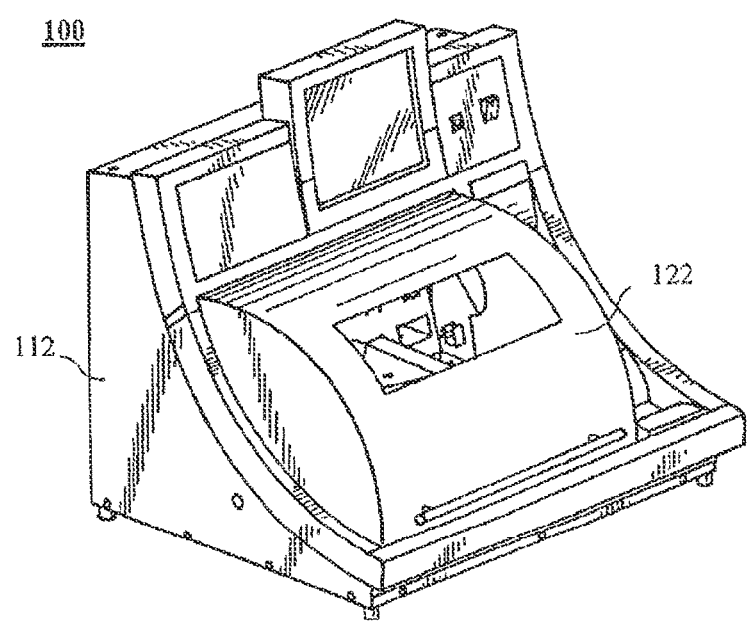
FIG. 2 is a perspective view of the alternator and starter motor tester of FIG. 1 depicting a protective door cover in a closed position according to an embodiment of the present disclosure.

FIG. 2 is a perspective view of the alternator and starter tester 100 of FIG. 1 depicting the protective door cover 122 in a closed position. In one embodiment, the alternator and starter tester 100 incorporates enhanced safety features, such as the protective door cover 122 to enclose moving parts during tests. The protective door cover 122 conceals the belt tensioning arrangement 116, the alternator mounting arrangement 118, the starter motor holder arrangement 120, and the test components, such as an alternator or starter motor from the user. The protective door cover 122 of the alternator and starter tester 100 is shown covering at least the belt tensioning arrangement 116, the alternator mounting arrangement 118, and the starter motor holder arrangement 120 in the closed position.

In the closed position, the protective door cover 122 eliminates the possibility of hands getting caught in moving parts or projectiles from being thrown towards customers or store personnel. In another embodiment, the protective door cover 122 has a door interlock switch (not shown) to disable tests while the protective door cover 122 is open. In still another embodiment, the protective cover includes a viewing window so that the operator can observe the testing components during the tests.

Figure 3:
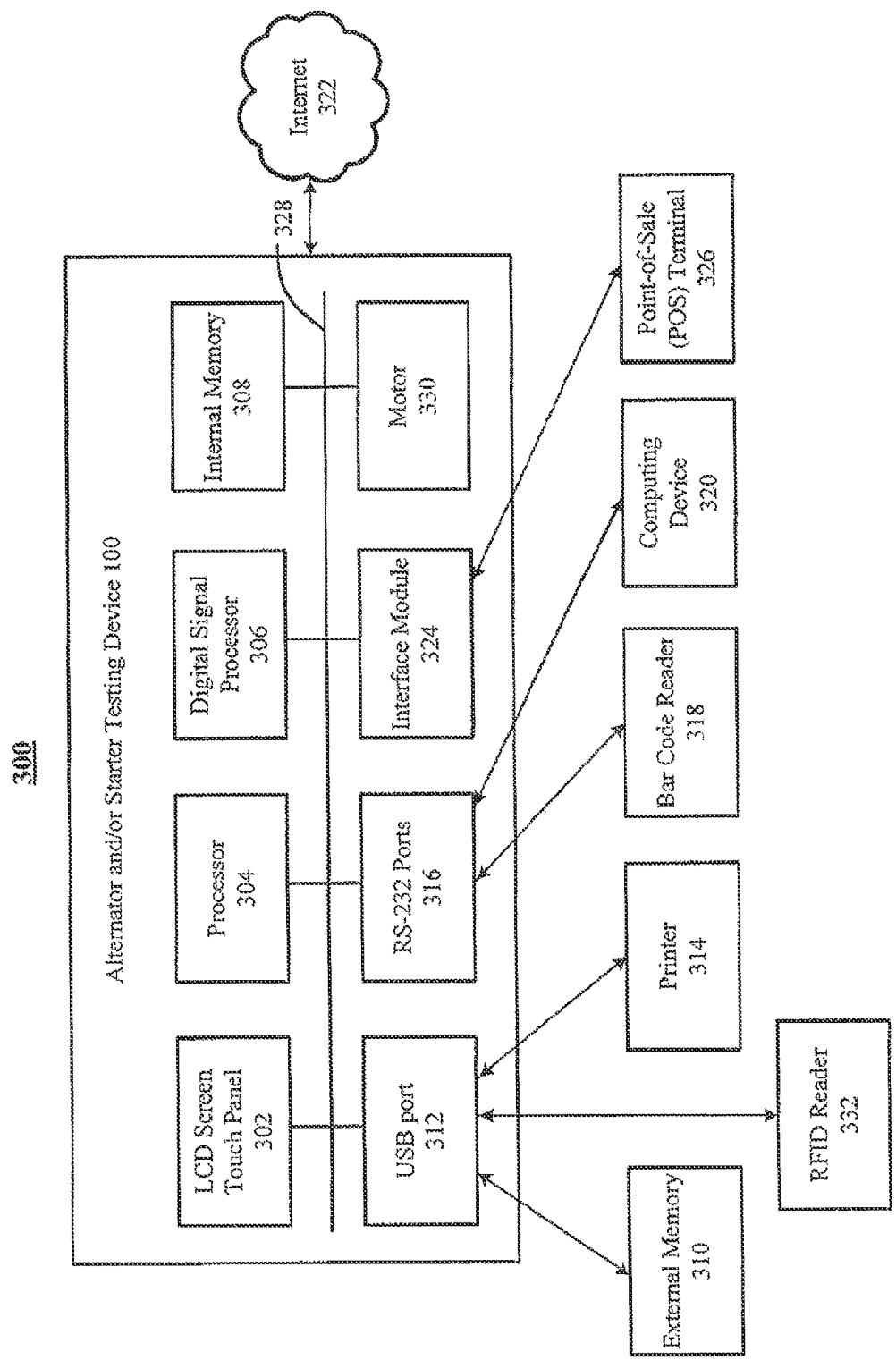
FIG. 3 is a block diagram of the main components of the alternator and starter tester of FIG. 1 according to an embodiment of the present disclosure.

FIG. 3 is a block diagram 300 of the components of the alternator and starter tester 100. The major components include a monitor screen 123, such as LCD screen 302 to display various information to the user. The LCD screen 302 can also be a touch panel to input information as desired by the user and can be controlled by a processor 304. Another component is the processor 304, which can be any processor or controller, including a FPGA (Field Programmable Gate Array). The processor 304 may be capable of running various OS (Operating System) including Linux, Apple Computer's Operating System (such as OS X), Windows, Windows CE and the like. The processor 304 also communicates with a digital signal processor 306, which includes an A/D converter. The processor 304 can communicate with the other components of the alternator and starter tester 100 via a communication bus 328.

The processor 304 can be configured to communicate with an internal memory 308 and external memory 310. The memory can be any memory including, for example, compact flash, SD (secure digital), USB flash drives, and the like. A USB (universal serial bus) port 312 eon communicate with the processor 304 and provides a connection for various USB devices, such as, for example an external memory 310, a printer 314 or a RFID (radio frequency identification) reader 332. The RFID reader 332 will read information about the component containing an RFID chip once it is within range. The MD chip may contain information about the alternator or starter motor such as alternator/starter type, serial number, manufacturer, date of production or shipment, previous test results, electrical specifications, maintenance information, serial number, lot number, warranty information, a manufacture data code, method of shipment and the like.

RS-232 ports 316 can also communicate with other external devices, such as a computing device 320 or a bar code reader 318. The computing device 320 can be any computing device, including a personal computer, a laptop, a PDA (personal digital assistant), a cell phone and the like.

The bar code reader 318 allows the user to scan from a bar code information that may be attached to the test component or the VIN (vehicle identification number) of the vehicle from which the test component came from. The bar code reader 318 may be, for example, a conventional optical bar code reader, such as a gun or wand type reader.

The operator swipes or aims the bar code reader onto a bar code that is associated with the particular starter or alternator to be tested and reads the bar code accordingly. The bar code itself may be affixed to the alternator or starter at the time of manufacture, purchase, shipment or service. The bar code may contain information, or point to information stored in a database. The database may be local or remotely located and accessible by the Internet, Ethernet, Wi-Fi, LAN, Bluetooth or other wireless or a wired connection.

The bar code may provide a variety of information regarding the alternator or starter to be tested. For example, the bar code may provide information regarding the alternator/starter type, serial number, manufacturer, date of production or shipment, previous test results, electrical specifications, maintenance information, serial number, lot number, warranty information, a manufacture data code, method of shipment and the like. Also, the bar code may provide information regarding the configuration of the connection port and/or the corresponding test adapter 126 and power leads 128 that should be coupled to the connection port to the alternator or starter motor to be tested. This data can be used to select parameters for the test cycle run in the alternator and starter tester 100. The data provided by the bar code is not limited to the examples given.

In some embodiments, the printer 314 may print bar code labels that may be attached or otherwise associated with the alternator or starter motor and provides updated information about the component. The updated information may include, among other things, service dates, service procedures (including the results), and warranty information (e.g., time left on warranty, who was the original purchaser, what types of service are and are not warranted, etc.). The printed label may then be read by the bar code reader 318 in subsequent tests. These features can eliminate possible typographical errors during manual input and by speeding up part number selection and entry by having a scanning capability.

In other embodiments, the printer 314 may print bar code labels of schematic diagram of the alternator or starter motor to be tested. For example, the schematic diagram may include connections ports, various components, electrical layout, mechanical layout, the test leads to be coupled to the connection ports and/or other data associated with the alternator or starter motor to be tested. The printed bar code label may then be read by the bar code reader 318 to identify the tester adapter 126 and test leads 128 coupled to the connection ports of the alternator or starter motor to be tested. The alternator or starter tester 100 may verify whether the correct test adapter 126 and test leads 128 are connected to the corresponding connection ports of the alternator and starter motor to be tested.

The present disclosure also has the ability to store and display or print technical bulletins associated with specific part numbers of components to be tested. Printouts of test results can give rebuilders access to data obtained by users to assist in the further analysis of that component.

The processor 304 can also communicate with an interface module 324. The interface module 324 may communicate with other external devices, such as a point-of-sale (POS) terminal 326. The interface module 324 by itself or along with the processor may generate a warranty claim code. The interface module 324 may provide the warranty claim code to the point-of-sale (POS) terminal 326. Subsequently, the point-of-sale (POS) terminal 326 may provide the warranty claim code to the supplier or the manufacturer of the tested components, as further discussed herein. In another exemplary embodiment, the interface module 324 may directly provide the warranty claim code to the supplier or the manufacturer of the tested components. The warranty claim code may assist the retailers and the suppliers or manufacturers to verify the validity of the warranty credit given to the returned components. In an exemplary embodiment, the retailers and the suppliers or manufacturers may verify the validity of the warranty credit given to the returned components by checking the model or part number of the returned components.

The interface module 324 may comprise a database (or access the internal memory 308 or external memory 310 that stores the database) for storing information associated with the tested components and information associated with the diagnostic test performed by the alternator and starter tester 100. The information associated with the tested components may include, but not limited to, alternator/starter type, serial number, manufacturer, date of production or shipment, previous test results, electrical specifications, maintenance information, serial number, lot number, warranty information, a manufacture data code, method of shipment and the like. The information associated with the diagnostic test performed by the alternator and starter tester 100 may include, but not limited to, test specification, test values, test results (including previous test results), data, time, employee, location, weather condition during testing (extreme cold or heat that may affect the test) and/or any other information associated with the diagnostic test. The interface module 324 may store the information or provide a summary report of warranty claim code associated with the tested components and information associated with the diagnostic tests performed by the alternator and starter tester 100 for a period of time.

The interface module 324 may provide the warranty claim code comprising the information associated with the tested components and information associated with the diagnostic test to the point-of-sale (POS) terminal 326. For example, the interface module 324 may encrypt the warranty claim code transmitted to the point-of-sale (POS) terminal 326 in order to maintain the integrity of the transmitted information. The interface module 324 may use various encryption algorithms to encrypt the warranty claim code transmitted to the point-of-sale (POS) terminal 326. For example, the encryption algorithms may include, but not limited to, tiny encryption algorithm (TEA), symmetric-key or asymmetric-key encryption algorithm, block encryption algorithm, steam encryption algorithm, public-key or private-key encryption algorithm, random number encryption algorithm, hash encryption algorithm, authentication code encryption algorithm or any other encryption algorithms. In another example, the interface module 324 may transmit the warranty claim code without encryption in order to save time and bandwidth.

The processor 304 can also interact with a networked computer, LAN (local area network), a smartphone, cellular phone or a distributed network, such as the Internet 322 and the like. This connection allows the user to update the tester and also send information regarding the test results to a remote location. The information sent or received can include, software, firmware, language, weather reports and database for the components to be tested or to the alternator and starter tester 100.

A motor 330 is also provided in order to test alternators. Motor 330 can simulate the engine of a vehicle and includes a pulley to mate with a belt. At one end, the belt is coupled to the motor 330's pulley and at the other end is coupled to the pulley of the alternator to be tested.

Figure 4:
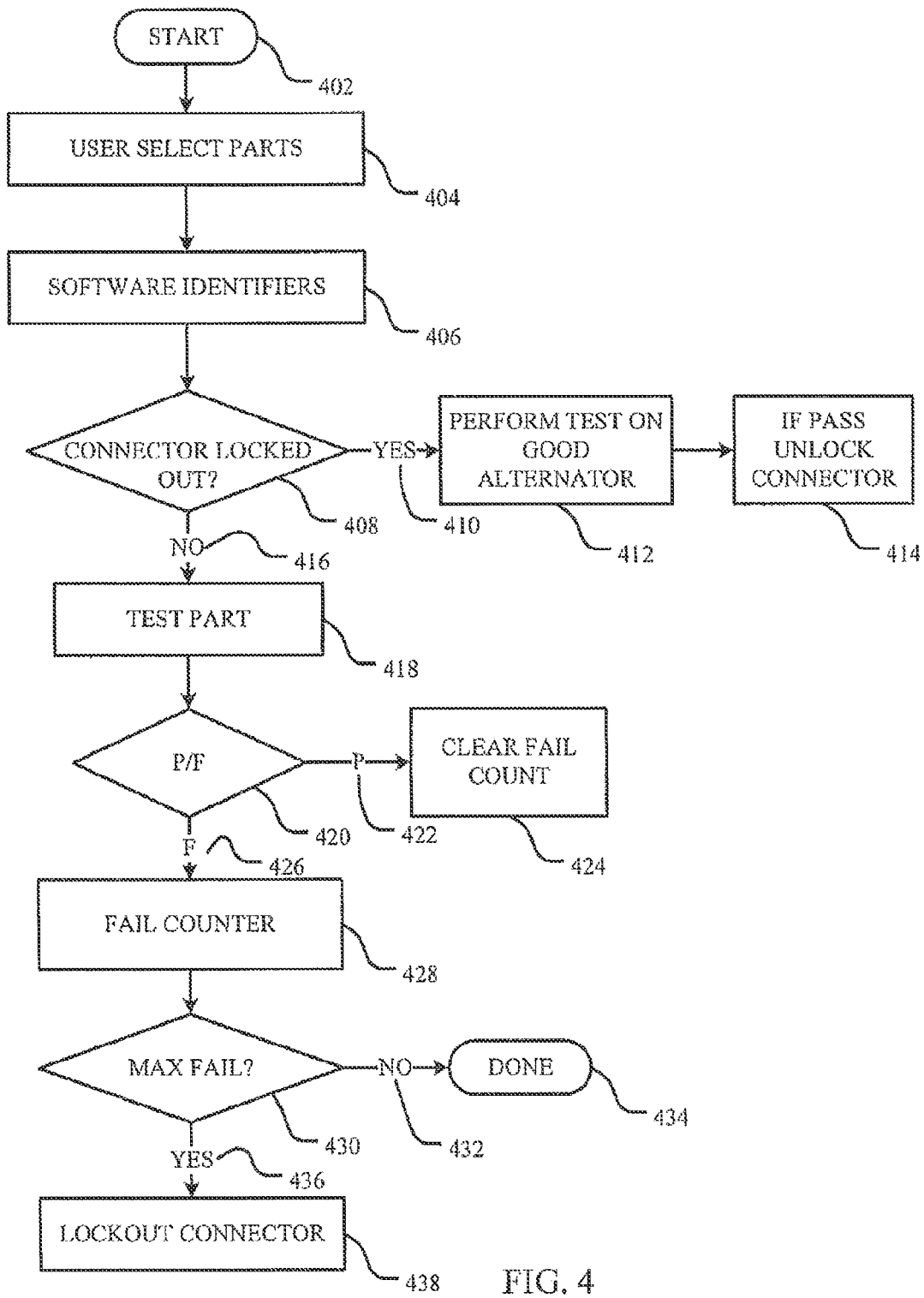
FIG. 4 illustrates art alternator cable check method of an embodiment of the present disclosure.

FIG. 4 illustrates an alternator cable check method 400 embodiment of the present disclosure. Currently there is no effective way of verifying that a test lead or connecter used to test an alternator is actually a good test lead. This could lead to failing a good component because of defective test leads and improperly paying a warranty claim. Because there are many different alternators with many different mechanical style electrical connectors, providing a conventional matting connector to conduct a loop-back test would not be a convenient or economical solution. To overcome this problem, software is provided to keep track of the number of times in sequence the tester fails an alternator, which uses a specific connector. The software keeps track of how many times a specific connector has failed sequentially when used with that type of alternator. If a preset number of failures are met, then software will "lock out" that specific connector so that it cannot be used in later testing. The operator can enable the "locked" connector by getting a known good alternator and re-running a test. If the test passes (i.e., the adapter is actually good), then the adapter can be re-enabled and be used in future tests.

Turning to FIG. 4, which illustrates method 400 that starts at step 402. The user selects the component or the part to test at step 404 through an input device, such as the LCD screen or the bar code or RFID chip. At step, 406, the software identifies the proper cable connector to the user. In the case of an alternator, the alternator connector is identified for the user. At step 408, the software detects whether the alternator connector is "locked out." This may done through sensing the alternator connector or through, for example, the bar code on the alternator connector. That is, the software will not allow the alternator to be tested with that connector. If yes 410, then the user is instructed via the LCD screen to perform a test with the connector on a good (known) alternator at step 412. If the connector passes, then the software "unlocks" the connector at step 414. When the connector is unlocked, it can again be used to test alternators. If the connector fails, then the connector remains "locked."

Turning back to step 408, if the connector is not locked 416, then the tester proceeds to test the component or part at step 418. At step 420, the software will note whether the alternator passes or fails. If pass 422, then clear any fail counts for this specific connector at step 424. If the alternator fails 426, then an increment counter is started for this specific connector at step 428.

At step 430, the software determines whether or not the connector has failed for a certain number of times. The number of times can be determined by the user and can range, for example, from 1-5, from 1-7, and another ranges desired by the user. If the maximum limit has not 432 been reached, then the method end at step 434 until the next test. If the maximum limit has been reached 436, then the alternator connector is locked out at step 438. When the adapter is locked out, it can be discarded or returned to the manufacturer. As stated above, the alternator connector can be "unlocked" if it passes another test using a good alternator. This method prevents the user from continue to use bad connectors that may provide inaccurate test results. Additionally, this method can also prevent good connectors from being discarded unless it fails a certain number of times.

Figure 5:
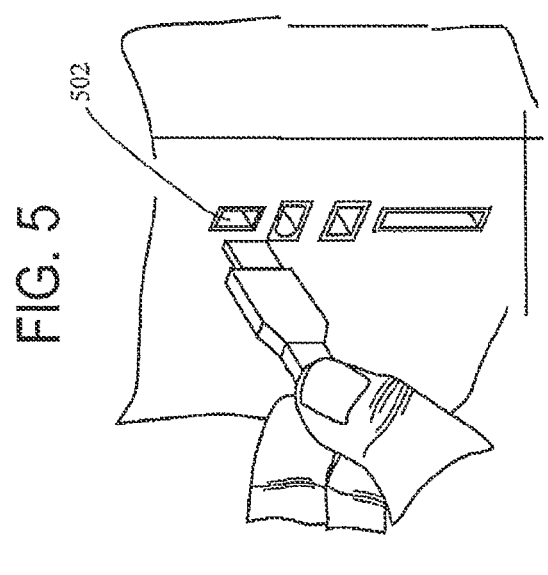
FIG. 5 is a perspective view of the peripheral and remote connections of the tester of FIG. 1 according to an embodiment of the present disclosure.

Referring to FIG. 5, in some embodiments of the alternator and starter tester, network connectivity may be used to track tests based on part number, employee and location in order to improve and enforce warranty reduction programs. The large-scale communication network ports can be constructed and arranged to receive an information relay device, such as an Ethernet wired module and/or an Ethernet wireless module. The Ethernet modules communicate at data rates of 10 Mbps (10Base-T Ethernet), 100 Mbps (Fast Ethernet), 1000 Mbps (Gigabit Ethernet) and other data rates. The information relayed can include data from the result of an alternator or starter test, the part's warranty information, the part type, the part make and model, previous tests, updates, diagnostic or operating parameters of the alternator and starter tester, maintenance data of the alternator and starter tester, and any other data required by the operator.

Referring to FIG. 5, in some embodiments, peripheral module ports 502 may be used to communicate to various peripheral devices such as a mouse, a keyboard, or a printer as well as to receive updates and/or downloads from a connected device such as a laptop or personal computer. The peripheral module ports may be a USB module having ports for a host connection and a function connection. The USB module may communicate as USB 1.1 or USB 2.0, 3.0 or other data rates. The host connection may accommodate a mouse, a keyboard, or a printer. The function connection may accommodate a laptop or personal computer.

Figure 6:
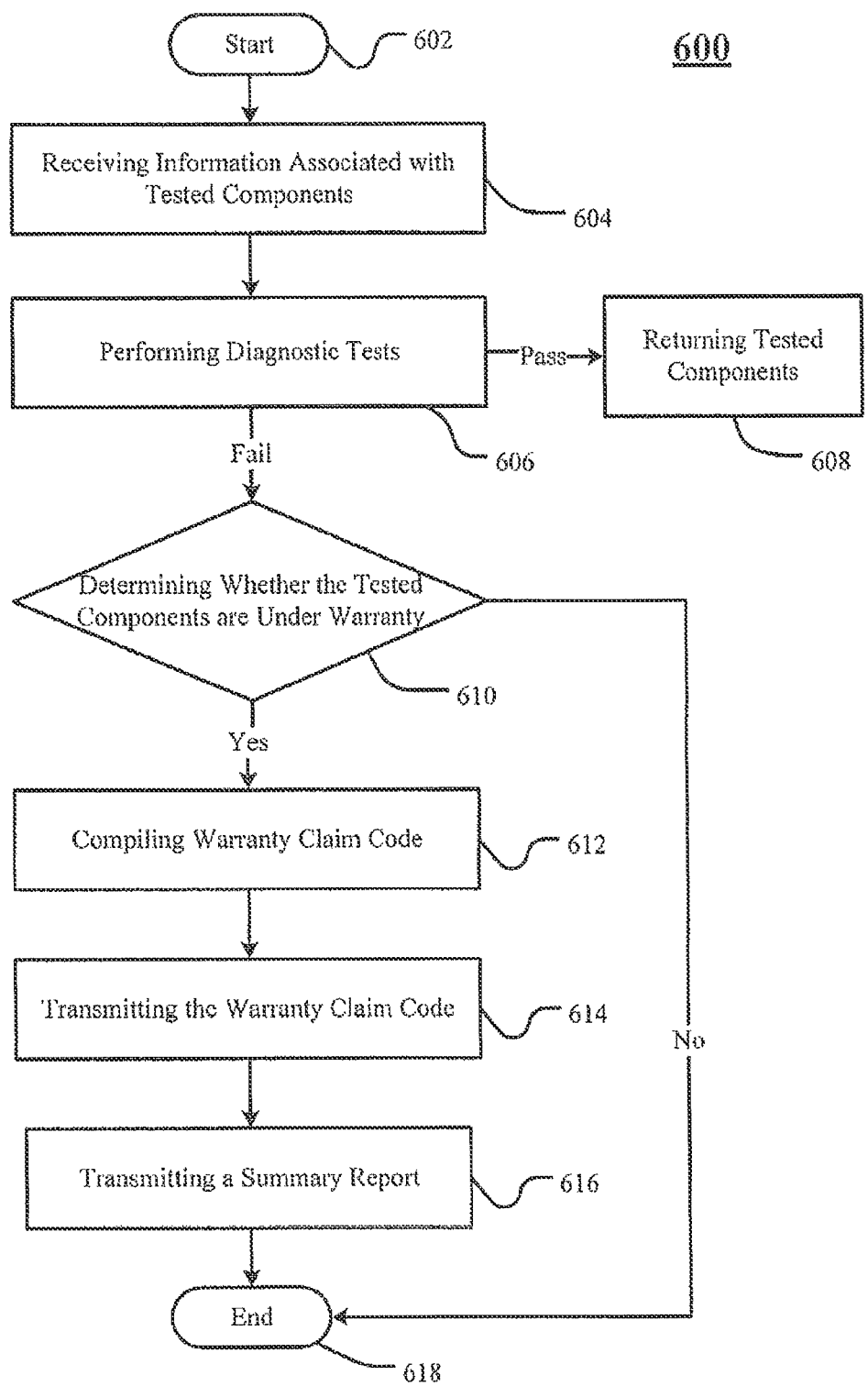
FIG. 6 illustrates the steps of transmitting warranty claim code according to an embodiment of the present disclosure.

FIG. 6 illustrates the steps for transmitting warranty claim code according to an embodiment of the present disclosure. This exemplary method 600 may be provided by way of example, as there are a variety of ways to carry out the method. The method 600 shown in FIG. 6 can be executed or otherwise performed by one or a combination of various systems. The method 600 is described below may be carried out by the system and networks shown in FIGS. 1-3, by way of example, and various elements of the system and network are referenced in explaining the exemplary method of FIG. 6. Each block shown in FIG. 6 represents one or more processes, methods, or subroutines carried out in exemplary method 600 and the steps are not limited to the order shown in the figure. Referring to FIG. 6, exemplary method 600 may begin at step 602.

At step 602, the method 600 for transmitting a warranty claim code may begin. At step 604, information associated with the tested components may be received. For example, an alternator or a starter may be tested to determine whether it is operating properly. The alternator or the starter may be taken to the alternator and starter tester 100 for diagnostic test. The information associated with the alternator or the starter may be inputted into the alternator and starter tester 100 manually via the LCD screen touch panel 302 or scanned in through the bar code reader 318 or RFID reader 332. For example, a user may manually input the parts number, model, make, year and/or any other information associated with the alternator or starter via the LCD screen touch panel 302. The information associated with the tested components may be automatically received. For example, the bar code reader 318 may scan the alternator or the starter to be tested to identify parts number, model, make, year and/or other information associated with the alternator or starter. The bar code reader 318 may automatically transmit the information associated with the alternator or the starter to the alternator and starter tester 100 via the RS-232 ports 316. After receiving information associated with the test components, the method 600 may proceed to step 606.

At step 606, diagnostic test may be performed. For example, diagnostic tests may be performed on the alternator or starter. For example, the alternator and starter tester 100 may perform diagnostic tests on the alternator or the starter in accordance with the method discussed herein. The alternator and starter tester 100 may determine whether the alternator or the starter is operating properly. The internal memory 308 of the alternator and starter tester 100 may store the information associated with the diagnostic tests and their results. In the event that the alternator or the starter pass the diagnostic test, the method 600 may proceed to step 608. In the event that the alternator or the starter do not pass the diagnostic test, the method 600 may proceed to step 610.

At step 608, if the alternator or starter passes the diagnostic test, then it may be returned to the customer. At step 610, whether the tested components are under warranty is determined. For example, the retailer may examine a record of purchase (e.g., a receipt or sent from a smartphone) to determine whether the tested components are still under warranty. In another example, the alternator and starter tester 100 may provide the information associated with the tested components (e.g., parts number) to the supplier or the manufacturer via the Internet 322 to determine whether the tested components are still under warranty. In the event that the tested components are not under warranty, the method 600 may proceed to step 618 and the method 600 for transmitting warranty claim code may end. In the event that the tested components are still under warranty, the method 600 may proceed to step 612.

At step 612, a warranty claim code may be generated. For example, the interface module 324 may generate a warranty claim code comprising information associated with tested components and information associated with the diagnostic results. The interface module 324 may generate the warranty claim code having a plurality of digits in order to transmit the necessary information. In an exemplary embodiment, the warranty claim code may be a 9 digit code containing diagnostic test specification (e.g., output current), date, time, diagnostic test result, parts number, diagnostic test output, tester that was used, the user of the tester, current (or over a period of time) weather condition, checksum code and/or any other necessary information. For example, the first digit of the warranty claim code may represent an output current represented as ASCII hex digit. The second digit of the warranty claim code may represent a date of the diagnostic test. The third digit of the warranty claim code may represent a time of the diagnostic test. The fourth digit may represent a diagnostic result (e.g., good, bad, invalid test, rectifier failure, low or high voltage, low or high current) of the diagnostic test. The fifth to seventh digit may represent parts number, weather information, user identification or any other identification information of the tested components. The eighth digit may represent output voltage value or output current value from the diagnostic test. The ninth digit may represent a check sum code in order to verify the integrity of the warranty claim code. After generating the warranty claim code, the method 600 may proceed to step 614.

At step 614, the warranty claim code may be transmitted. For example, the interface module 324 may encrypt the warranty claim code for transmission. For example, the interface module 324 may encrypt the warranty claim code to ensure the integrity of the warranty claim code during transmission. The interface module 324 may transmit the warranty claim code to the point-of-sale (POS) terminal 326 and the point-of-sale (POS) terminal 326 may transmit the encrypted warranty claim code to the supplier or the manufacturer to verify the validity of the warranty credit. In another example, the interface module 324 may transmit the encrypted warranty claim code directly to the supplier or the manufacturer via the Internet 322 in order to verify the validity of the warranty credit. In other examples, the interface module 324 may print the warranty claim code via the printer 314 and the user may manually input the printed warranty claim code into the point-of-sale (POS) terminal 326. Subsequently, the point-of-sale (POS) terminal 326 may transmit the warranty claim code to the supplier or the manufacturer to verify the validity of the warranty credit. After transmitting the warranty claim code, the method 600 may proceed to step 616.

At step 616, a summary report may be transmitted. For example, the alternator and starter tester 100 may provide a summary report of the warranty claim code for a period of time. For example, the internal memory 308 may store information associated with the test component, information associated with the diagnostic tests and warranty claim code for a period of time. The alternator and starter tester 100 may provide a summary report of warranty code containing information associated with the test components and information associated with the diagnostic tests to the supplier or manufacturer. After transmitting a summary report, the method 600 may end at step 618.

Figure 7:
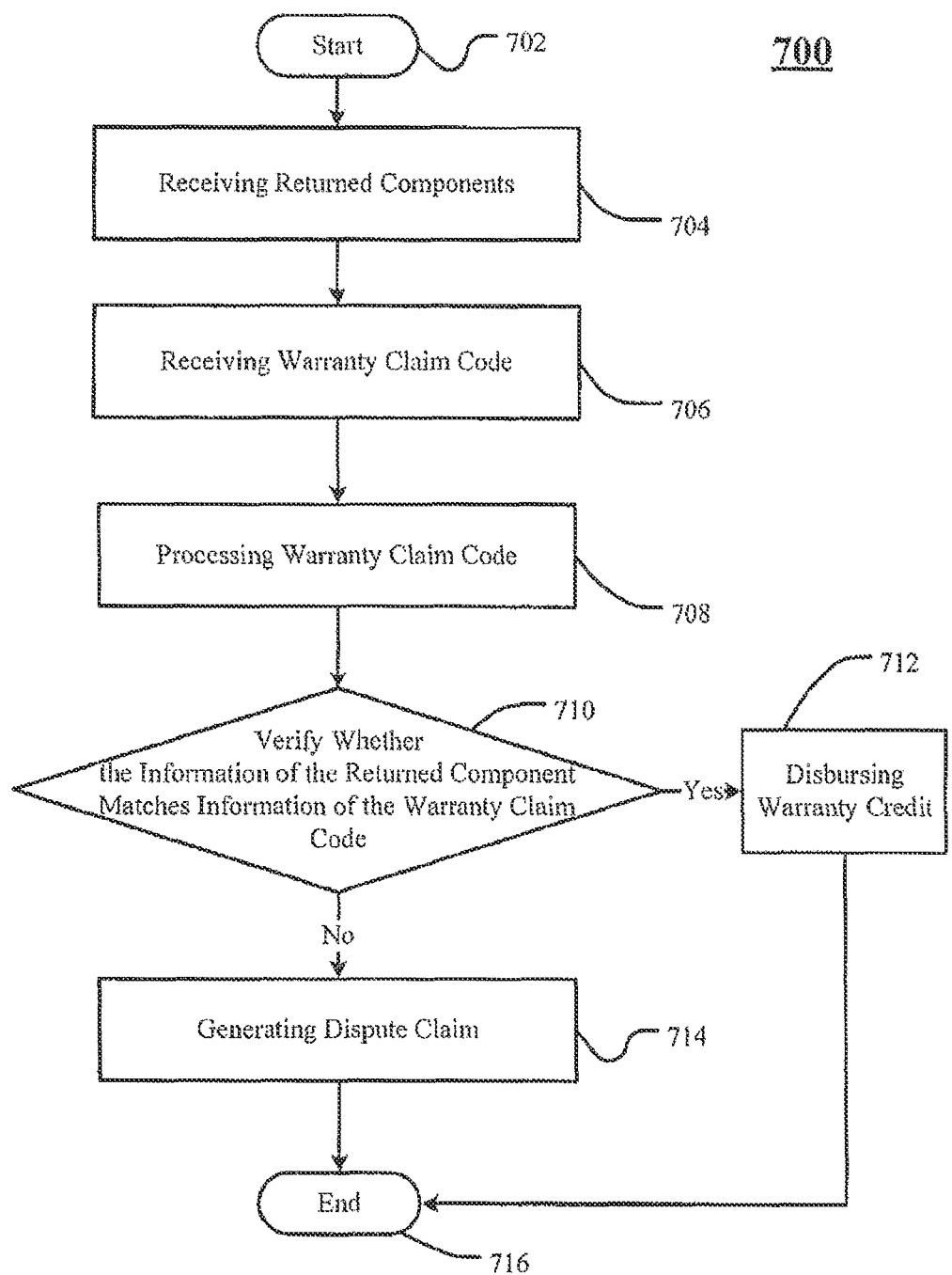
FIG. 7 illustrates the steps of processing warranty claim code according to an embodiment of the present disclosure.

FIG. 7 illustrates the steps for processing warranty claim code according to an embodiment of the present disclosure. This exemplary method 700 may be provided by way of example, as there are a variety of ways to carry out the method. The method 700 shown in FIG. 7 can be executed or otherwise performed by one or a combination of various systems. The method 700 is described below may be carried out by the system and networks shown in FIGS. 1-3, by way of example, and various elements of the system and network are referenced in explaining the exemplary method of FIG. 7. Each block shown in FIG. 7 represents one or more processes, methods, or subroutines carried out in exemplary method 700 and are not limited to the order shown.

Referring to FIG. 7, exemplary method 700 may begin at step 702. At step 704, returned components may be received. For example, an alternator or a starter motor may fail a diagnostic test performed by the alternator and starter tester 100 and returned to the supplier or manufacturer. After receiving returned components, the method 700 may proceed to step 706.

At step 706, warranty claim code may be received. For example, the warranty claim code may be received from the alternator and starter tester 100 via the Internet 322. In another exemplary embodiment, the warranty claim code may be received from the point-of-sale (POS) terminal 326 via the Internet 322. In other exemplary embodiments, the warranty claim code may be attached (bar code, RFID, etc.) to the returned components. For example, the alternator and starter tester 100 may print out information associated with the diagnostic test via the printer 314 and the print out information is attached to the returned alternator or starter motor. The owner via his smartphone may also send the warranty claim code. After receiving the warranty claim code, the method 700 may proceed to step 708.

At step 708, the warranty claim code may be processed. For example, the supplier or manufacturer may process the warranty claim code. In an exemplary embodiment, the supplier or manufacturer may decrypt the warranty claim code in order to identify information associated with the returned components and information associated with the diagnostic tests. The supplier or manufacturer may store the information associated with the returned components and information associated with the diagnostic tests. After processing the warranty claim code, the method 700 may proceed to step 710.

At step 710, verify whether the information associated with the returned components matches the information of the warranty claim code. For example, the supplier or manufacturer may compare the information of the returned components that it has in its database with the information in the warranty claim code. The supplier or manufacturer may verify whether the information of the returned components matches the information in the warranty claim code. In the event that the information associated with the returned components matches the information in the warranty claim code, the method may proceed to step 712 if not match then proceed to step 714. In another embodiment, if it can be determined (statistical analysis) that a user or location of the tester has failed too many components as compared to other locations or users, then the method proceeds to step 714.

At step 712, a warranty credit may be disbursed. For example, the supplier or manufacturer may disburse the warranty credit to the testing location or the owner of the components after verifying that the information of the returned components matches the information on the warranty claim code. After disbursing a warranty credit, the method 700 may end at step 716.

If the information does not match, at step 714, a dispute claim may be generated. For example, the supplier or manufacturer may generate a dispute claim after determining that the information associated with returned components does not match the information of the warranty claim code. For example, the dispute claim may identify at least one difference between the information associated with the returned components and the information of the warranty claim code. The dispute claim may also identify information associated with the diagnostic test performed on the returned component. For example, the dispute claim may include test results, data, time, employee, and location of the diagnostic tests. This way, if it was determined that the location or the user of the tester had too many returns as compared to other locations or user, the dispute claim can be used to resolve this issue. After generating a dispute claim, the method 700 may proceed to step 716 and end.

The many features and advantages of the present disclosure are apparent from the detailed specification, and thus, it is intended by the appended claims to cover all such features and advantages of the present disclosure, which fall within the true spirit, and scope of the present disclosure. Further, since numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

What is claimed is:

1. An alternator and starter motor tester, comprising:
   a reader configured to read the identification information of a component, the component including the alternator or the starter, wherein the reader is a bar code reader or RFID (radio frequency identification) reader;
   a memory configured to store the information and software to operate the tester;
   a motor configured to simulate an engine of a vehicle;
   wherein the tester is configured to test the component based on the identification information;
   a processor configured to communicate with the reader, the memory, the motor, and the tester, the processor being configured to execute the software and control the tester in response to computer readable instructions in the software, wherein in response to the computer readable instructions, the processor is configured to receive the identification information of the component and access a database for storing information associated with the tested components and information associated with the diagnostic test performed by the alternator and starter tester;
   the processor being further configured to generate a warranty claim code, the warranty code having the identification information of the component, a date of testing, a time of testing, an identity of the tester, a weather condition of the testing, and a test result of the component;
   the processor further again configured to provide a summary report of a plurality of diagnostic tests performed over time, wherein the processor is in communication with a point-of-sale terminal and wherein the processor is configured to transmit the warranty claim code and the summary report to the point-of-sale terminal to verify the validity of a warranty credit; and
   wherein the processor is further again configured to access and compare the database to the component identification information to determine if the component is connected to a proper cable connector prior to initiating testing of the component and lock out the cable connector in response to the connector failing.

2. The tester of claim 1, wherein the identification information of the component comprises at least one of part's number, model, make and year.

3. The tester of claim 1 further comprising a printer operably coupled to the processor and prints the warranty claim code.

4. The tester of claim 1, wherein warranty claim code comprises information associated with, a location of the test and a user of the tester.

5. The tester of claim 1, wherein the information associated with the test result comprises at least one of a diagnostic test specification, values, date, time and results.

6. The tester of claim 4, wherein an interface module encodes and encrypts the warranty claim code.

7. The tester of claim 1, wherein the warranty claim code comprises a checksum code.

8. A method of testing a starter motor or an alternator, comprising the steps of:
- receiving information associated with a component via an input device;
- comparing the information associated with the component to a database entry for the component, the component including the alternator or the starter motor;
- determining a proper cable connector for the component;
- sensing if the component is connected to the proper cable connector for the component;
- locking out the connector in response to determining the connector is not the proper cable connector for the component;
- performing a diagnostic test on the component with a component tester;
- determining if the component is under warranty in response to the component failing the diagnostic test, wherein the determination of the component being under warranty is based on the information associated with the component and a result of the diagnostic test performed on the component;
- generating, via a processor, a warranty claim code based at least in part on the information associated with the component, the determination of whether the component is under warranty, a weather condition during the test, a location of the test, a user of the component tester, and a test result;
- generating, via a processor, a summary report based on a plurality of diagnostic tests performed over time based at least in part on the information associated with the component, the determination of whether the component is under warranty, and a plurality of test results;
- transmitting the warranty claim code and the summary report to a point-of-sale terminal via an interface module; and
- verifying a validity of a warranty claim based on the warranty claim code.

9. The method of claim 8, wherein the information associated with the component comprises at least one of part's number, model, make and year.

10. The method of claim 8 further comprising the steps of:
- encoding and encrypting the warranty claim code with the interface module.

11. The method of claim 8 further comprising the step of:
- providing a credit for a failed component that is still under warranty based on the warranty claim code.

12. The method of claim 8 further comprising the steps of:
- determining if fraud has occurred based on the user or location information; and
- generating a claim dispute when fraud is determined.

13. The method of claim 8, wherein the test results comprises at least one of a diagnostic test specification, values, date, time and results.

14. The method of claim 8, wherein generating the warranty claim code further comprises generating a check sum.

15. The method of claim 8 further comprising the steps of:
- comparing known component information with the information in the warranty claim code; and
- determining if the component is still under warranty based on the comparison.

* * * * *